(12) United States Patent
Amirkhany et al.

(10) Patent No.: US 11,081,064 B1
(45) Date of Patent: Aug. 3, 2021

(54) REFERENCE SIGNAL GENERATION BY REUSING THE DRIVER CIRCUIT

(71) Applicant: Samsung Display Co., Ltd., Yongin-si (KR)

(72) Inventors: Amir Amirkhany, Sunnyvale, CA (US); Younghoon Song, Santa Clara, CA (US); Ranick Ng, Pleasanton, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/869,546

(22) Filed: May 7, 2020

Related U.S. Application Data

(60) Provisional application No. 62/960,447, filed on Jan. 13, 2020.

(51) Int. Cl.
| | | |
|---|---|---|
| *G09G 3/3291* | (2016.01) | |
| *H03M 1/66* | (2006.01) | |
| *H03F 3/45* | (2006.01) | |

(52) U.S. Cl.
CPC ............ *G09G 3/3291* (2013.01); *H03M 1/66* (2013.01); *G09G 2310/0297* (2013.01); *G09G 2310/066* (2013.01); *H03F 3/45475* (2013.01)

(58) Field of Classification Search
CPC .. G09G 3/3291; G09G 3/3233; G09G 3/3241; G09G 3/3258; G09G 3/3275; G09G 2300/043; G09G 2310/0297; G09G 2310/066; G09G 2320/0233; G09G 2320/043; G09G 2320/045; H03M 1/66; H03F 3/45475

USPC ........................................................ 345/208
See application file for complete search history.

(56) References Cited

U.S. PATENT DOCUMENTS

| | | | |
|---|---|---|---|
| 5,239,210 | A | 8/1993 | Scott |
| 6,320,565 | B1 | 11/2001 | Albu et al. |
| 6,753,913 | B1 | 6/2004 | Bilhan et al. |
| 6,822,679 | B1 | 11/2004 | Kulhalli et al. |
| 6,909,391 | B2 | 6/2005 | Rossi |
| 6,919,551 | B2 | 7/2005 | Barna et al. |
| 7,245,321 | B2 | 7/2007 | Panicacci et al. |

(Continued)

FOREIGN PATENT DOCUMENTS

| | | |
|---|---|---|
| EP | 0 986 900 B1 | 8/2005 |
| EP | 2 738 757 A1 | 6/2014 |

(Continued)

OTHER PUBLICATIONS

Extended European Search Report for corresponding European Patent Application No. 20156633.8, dated Apr. 16, 2020, 9 pages.

(Continued)

*Primary Examiner* — Tom V Sheng
(74) *Attorney, Agent, or Firm* — Lewis Roca Rothgerber Christie LLP

(57) ABSTRACT

A display compensation circuit includes a driver circuit including a digital-to-analog converter (DAC), the driver circuit configured to drive pixels of a display panel; and a compensation circuit including a current-mode sensing circuit and a reference current generator circuit, the compensation circuit configured to determine a value to compensate for pixel variations across the display panel, the reference current generator circuit configured to generate a reference current using the DAC of the driver circuit.

20 Claims, 7 Drawing Sheets

(56) References Cited

U.S. PATENT DOCUMENTS

| | | | |
|---|---|---|---|
| 7,764,118 | B2 | 7/2010 | Kusuda et al. |
| 8,497,731 | B1 | 7/2013 | Beckwith et al. |
| 8,659,325 | B2 | 2/2014 | Nishi |
| 9,191,598 | B2 | 11/2015 | Blanquart et al. |
| 9,721,504 | B2 * | 8/2017 | Kim ................ G09G 3/3225 |
| 9,722,582 | B2 | 8/2017 | Jung |
| 10,714,051 | B1 | 7/2020 | Huang et al. |
| 10,762,836 | B1 * | 9/2020 | Bae .................. G09G 3/3233 |
| 2005/0243193 | A1 | 11/2005 | Gove et al. |
| 2005/0248671 | A1 | 11/2005 | Schweng |
| 2006/0139097 | A1 | 6/2006 | Mukherjee et al. |
| 2006/0238477 | A1 | 10/2006 | Lew et al. |
| 2007/0030262 | A1 | 2/2007 | Ambo et al. |
| 2007/0080908 | A1 | 4/2007 | Nathan et al. |
| 2009/0058324 | A1 | 3/2009 | Nakao |
| 2009/0237121 | A1 | 9/2009 | Surendranath et al. |
| 2009/0295422 | A1 | 12/2009 | Hamer et al. |
| 2010/0271517 | A1 | 10/2010 | De Wit et al. |
| 2013/0082936 | A1 | 4/2013 | Islamkulov et al. |
| 2013/0099692 | A1 * | 4/2013 | Chaji ............... G09G 3/3283 315/224 |
| 2013/0100173 | A1 * | 4/2013 | Chaji .................. G09G 5/10 345/690 |
| 2013/0141368 | A1 | 6/2013 | Wang et al. |
| 2014/0152642 | A1 | 6/2014 | Kim et al. |
| 2014/0198092 | A1 | 7/2014 | Azizi et al. |
| 2015/0009204 | A1 * | 1/2015 | Chaji ............... G09G 3/3233 345/214 |
| 2015/0195569 | A1 | 7/2015 | Jung et al. |
| 2015/0213757 | A1 * | 7/2015 | Takahama ........ G09G 3/3233 345/691 |
| 2015/0243221 | A1 | 8/2015 | Lim |
| 2015/0261341 | A1 | 9/2015 | Weinerth et al. |
| 2016/0005358 | A1 * | 1/2016 | Wang ............... G09G 3/3233 345/212 |
| 2016/0012765 | A1 | 1/2016 | Jeong |
| 2016/0055791 | A1 | 2/2016 | Kishi et al. |
| 2016/0086539 | A1 | 3/2016 | Mizukoshi |
| 2016/0202061 | A1 | 7/2016 | Maurer et al. |
| 2016/0261817 | A1 | 9/2016 | Totsuka et al. |
| 2016/0267844 | A1 * | 9/2016 | Senda ............... G09G 3/3291 |
| 2016/0372044 | A1 | 12/2016 | Kwon et al. |
| 2017/0003779 | A1 | 1/2017 | Reynolds et al. |
| 2017/0039939 | A1 | 2/2017 | Chaji |
| 2017/0039953 | A1 | 2/2017 | Lee |
| 2017/0090669 | A1 | 3/2017 | Paladugu et al. |
| 2017/0093421 | A1 | 3/2017 | Bell et al. |
| 2017/0154573 | A1 * | 6/2017 | Woo .................. G09G 3/3291 |
| 2018/0090042 | A1 | 3/2018 | Lin et al. |
| 2018/0100943 | A1 | 4/2018 | Sternberg |
| 2018/0114815 | A1 | 4/2018 | Lee et al. |
| 2018/0166515 | A1 * | 6/2018 | An .................... G09G 3/3291 |
| 2018/0182303 | A1 | 6/2018 | Jung et al. |
| 2018/0336816 | A1 | 11/2018 | Shin et al. |
| 2019/0035351 | A1 | 1/2019 | Pyun et al. |
| 2019/0088205 | A1 | 3/2019 | Zhang et al. |
| 2019/0221146 | A1 | 7/2019 | Lin et al. |
| 2019/0247664 | A1 | 8/2019 | Irazoqui et al. |
| 2019/0336757 | A1 | 11/2019 | Rodriguez et al. |
| 2020/0091884 | A1 | 3/2020 | Venkatraman et al. |
| 2020/0184888 | A1 * | 6/2020 | Brownlow .......... G09G 3/325 |
| 2020/0202787 | A1 | 6/2020 | Do et al. |

FOREIGN PATENT DOCUMENTS

| | | |
|---|---|---|
| EP | 3 343 556 A1 | 7/2018 |
| KR | 10-2008-0107064 A | 12/2008 |
| KR | 10-2013-0053458 A | 5/2013 |

OTHER PUBLICATIONS

U.S. Notice of Allowance dated Dec. 11, 2020, issued in U.S. Appl. No. 16/656,447 (10 pages).
U.S. Appl. No. 16/656,423, filed Oct. 17, 2019.
U.S. Appl. No. 16/656,447, filed Oct. 17, 2019.
U.S. Appl. No. 16/657,680, filed Oct. 18, 2019.
Chen, Hsin-Liang, et al.; A Low-Offset Low-Noise Sigma-Delta Modulator With Pseudorandom Chopper-Stabilization Technique, IEEE Transactions on Circuits and Systems—I: Regular Papers, vol. 56, No. 12, Dec. 2009, 11 pages.
Extended European Search Report for corresponding European Patent Application No. 20179974.9, dated Aug. 20, 2020, 12 pages.
Extended European Search Report for corresponding European Patent Application No. 20176949.4, dated Aug. 27, 2020, 13 pages.
U.S. Notice of Allowance dated Sep. 9, 2020, issued in U.S. Appl. No. 16/657,680 (8 pages).
U.S. Office Action dated Aug. 7, 2020, issued in U.S. Appl. No. 16/656,447 (26 pages).
U.S. Office Action dated Nov. 5, 2020, issued in U.S. Appl. No. 16/848,706 (22 pages).
U.S. Notice of Allowance dated Jun. 1, 2021, issued in U.S. Appl. No. 16/656,423 (13 pages).

* cited by examiner

REFERENCE SIGNAL GENERATION BY REUSING THE DRIVER CIRCUIT

CROSS-REFERENCE TO RELATED APPLICATION(S)

The present application claims priority to and the benefit of U.S. Provisional Patent Application Ser. No. 62/960,447, filed Jan. 13, 2020 and entitled "Reference Generation Based on Ramp, Reusing the Driver Circuit," the entire content of which is hereby expressly incorporated by reference.

FIELD

One or more aspects of embodiments according to the present disclosure relate to displays, and more particularly to a system and method for reference signal generation by reusing the driver circuit.

BACKGROUND

A video display such as those used for computers or mobile devices may have a plurality of pixels, and, in each pixel, a plurality of transistors, including a drive transistor configured to control a drive current through a display element such as a light emitting diode (LED) (e.g., an organic light emitting diode (OLED)). Variations between the characteristics of the drive transistors (e.g., thin film transistor (TFT)) of the display, or changes with time of the characteristics of any one of the drive transistors may, if not compensated for, degrade the quality of images or video displayed by the display. To compensate for such variation, or changes, it may be desirable to measure the characteristics of the drive transistors.

The above information disclosed in this Background section is only for enhancement of understanding of the background of the invention and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a system and method for reference signal generation by reusing the driver circuit.

In some embodiments, a display compensation circuit includes a driver circuit including a digital-to-analog converter (DAC), the driver circuit configured to drive pixels of a display panel; and a compensation circuit including a current-mode sensing circuit and a reference current generator circuit, the compensation circuit configured to determine a value to compensate for pixel variations across the display panel, the reference current generator circuit configured to generate a reference current using the DAC of the driver circuit.

In some embodiments, the DAC is coupled to a data line of the display, wherein the driver circuit further includes a multiplexer, a digital logic circuit, and a voltage buffer, wherein the multiplexer is connected to the DAC and the digital logic circuit at an input terminal of the multiplexer, wherein an input terminal of the voltage buffer is connected to an output terminal of the multiplexer, wherein the driver circuit is configured to generate a voltage ramp at an output terminal of the voltage buffer, and wherein the reference current generator circuit includes a capacitor bank, an input terminal of the reference current generator circuit being connected to the output terminal of the voltage buffer, the reference current generator circuit being configured to generate the reference current based on a capacitance value of the capacitor bank and a voltage ramp value of the voltage ramp received from the voltage buffer of the driver circuit.

In some embodiments, the multiplexer is coupled to the DAC via the data line of the display, wherein the voltage ramp is generated by the DAC, the multiplexer, and the digital logic circuit of the driver circuit, wherein the data line of the display is a 10-bit data line, wherein the pixel variations comprise threshold voltage and mobility variations of a driving transistor of a pixel of the display panel, and wherein the display compensation circuit is external to the display panel.

In some embodiments, the input terminal of the multiplexer includes a positive input terminal and a negative input terminal, wherein the positive input terminal of the voltage buffer is connected to the output terminal of the multiplexer and the negative input terminal of the voltage buffer is connected to the output terminal of the voltage buffer.

In some embodiments, the capacitor bank of the reference current generator circuit is connected to the output terminal of the voltage buffer of the driver circuit via a first switch at the input terminal of the capacitor bank, wherein the first switch is a transistor switch. In some embodiments, the reference current is equal to $C*dV/dt$, wherein C is the capacitance value of the capacitor bank and $dV/dt$ is the voltage ramp value, wherein dV is change in voltage over time t at the output terminal of the voltage buffer, and wherein the capacitor bank is a variable capacitor and wherein the reference current generator circuit is configured to generate a plurality of reference current values based on different capacitance values of the variable capacitor.

In some embodiments, the current-mode sensing circuit is connected at an output terminal of the reference current generator circuit via a second switch, wherein the second switch is a transistor switch. In some embodiments, the current-mode sensing circuit includes a differential low-pass filter having a differential input and a differential output, a first conductor of the differential input being configured to receive a difference between a pixel current and a reference current; a differential integrator having a differential input and a differential output; and two mirroring capacitors coupling the differential output of the differential low-pass filter to the differential input of the differential integrator.

In some embodiments, the differential low-pass filter includes a differential amplifier; two feedback capacitors, each connected between a respective conductor of the differential output of the differential low-pass filter and a corresponding conductor of the differential input of the differential low-pass filter; and two reset switches, each connected across a respective feedback capacitor of the two feedback capacitors and configured to selectively discharge the respective feedback capacitor.

In some embodiments, the differential amplifier is a fully differential amplifier. In some embodiments, the differential amplifier is a pseudo differential amplifier. In some embodiments, the differential integrator includes a fully differential amplifier; two feedback capacitors, each connected between a respective conductor of the differential output of the differential integrator and a corresponding conductor of the differential input of the differential integrator; and two reset switches, each connected across a respective feedback capacitor of the two feedback capacitors and configured to selectively discharge the respective feedback capacitor.

In some embodiments, a system includes a display having a plurality of pixels and a display driver configured to drive the plurality of pixels of the display, the display driver including a pixel driver; and a capacitor bank; wherein the pixel driver includes a multiplexer, a digital logic circuit, and a voltage buffer, wherein the multiplexer is connected to the digital logic circuit at an input terminal of the multiplexer, an input terminal of the voltage buffer is connected to an output terminal of the multiplexer, and an input terminal of the capacitor bank is connected to an output terminal of the voltage buffer, wherein the capacitor bank is configured to generate a reference current to compensate characteristics of a pixel of the display based on a capacitance value of the capacitor bank and a voltage ramp value of a voltage ramp at the output terminal of the voltage buffer.

In some embodiments, the display driver further includes a digital-to-analog converter (DAC) coupled to a data line of the display, wherein the multiplexer is connected to the DAC at the input terminal of the multiplexer.

In some embodiments, the voltage buffer is configured to generate the voltage ramp at the output terminal of the voltage buffer. In some embodiments, the capacitor bank is configured to generate the reference current based on the capacitance value of the capacitor bank and the voltage ramp value of the voltage ramp at the output terminal of the voltage buffer. In some embodiments, the reference current is equal to C*dV/dt, wherein C is the capacitance value of the capacitor bank and dV/dt is the voltage ramp value, wherein dV is change in voltage over time t at the output terminal of the voltage buffer.

In some embodiments, the input terminal of the multiplexer includes a positive input terminal and a negative input terminal, wherein the positive input terminal of the voltage buffer is connected to the output terminal of the multiplexer and the negative input terminal of the voltage buffer is connected to the output terminal of the voltage buffer. In some embodiments, the capacitor bank is a variable capacitor and wherein the system is configured to generate a plurality of reference current values based on different capacitance values of the variable capacitor.

In some embodiments, a method for generating a reference current to compensate characteristics of a pixel of a display, the method includes generating a voltage ramp at an output terminal of a driving amplifier of a pixel driver, wherein the driving amplifier is configured to receive input from a multiplexer and a digital logic circuit of the pixel driver and generate the voltage ramp based on the input received from the multiplexer and the digital logic circuit; performing multiplication of a value of the voltage ramp and a capacitance value of a capacitor bank connected at the output terminal of the driving amplifier; and generating the reference current at an output terminal of the capacitor bank to compensate mobility and voltage threshold characteristics of the pixel of the display.

BRIEF DESCRIPTION OF THE DRAWINGS

These and other features of some example embodiments of the present disclosure will be appreciated and understood with reference to the specification, claims, and appended drawings, wherein:

DETAILED DESCRIPTION

The detailed description set forth below in connection with the appended drawings is intended as a description of some example embodiments of a system and method for reference signal generation by reusing the driver circuit provided in accordance with the present disclosure and is not intended to represent the only forms in which the example embodiments of the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
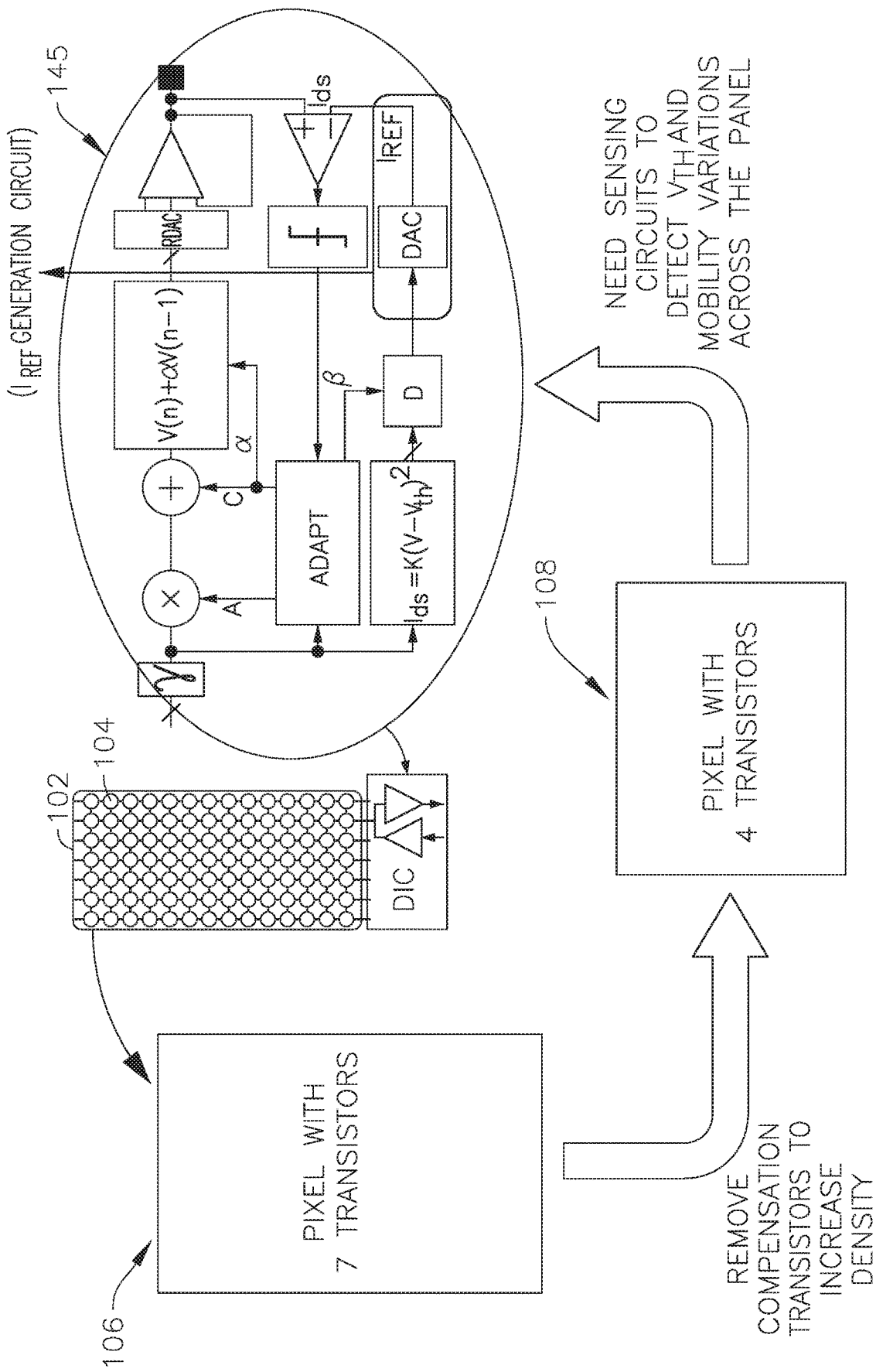
FIG. 1A illustrates different components of a display in an electronic device, according to some embodiments of the present disclosure.

FIG. 1A illustrates different components of a display in an electronic device, according to some example embodiments of the present disclosure. Referring to FIG. 1A, in some embodiments a display (e.g., a mobile device display) 102 may include a plurality of pixels 104 arranged in rows and columns. Each pixel 104 in the display 102 may include a drive circuit, e.g., a 7-transistor 1-capacitor (7T1C) drive circuit 106 or a 4-transistor 1-capacitor (4T1C) drive circuit 108. In some embodiments, the 7T1C drive circuit 106 structure includes compensation transistors. For Example, in some embodiments, the 7T1C pixel structure includes self-driving transistor threshold voltage or TFT Vth calibration. However, such pixel structure (e.g., 7T1C) may be slow and may require a large area (e.g., which may reduce the aspect ratio of the structure). In order to achieve higher pixel density, which is desired in many display structures (e.g., 4K-8K etc.), the compensation transistors incorporated in the 7T1C structure (e.g., 7T1C driver circuit 106 structure) may be removed to be arrived at 4T1C structure (e.g., 4T1C drive circuit 108 structure), which requires external compensation. In FIG. 1A, the external compensation to the 4T1C structure is the circuit 145.

In some embodiments, in the 4T1C drive circuit 108, a drive transistor controls the current through the light emitting diode when the pixel (e.g., pixel 104) is emitting light. The gate to source voltage ($V_{gs}$) of the drive transistor is controlled by the capacitor. For example, during line time, driver voltage may be store in the capacitor, and that voltage may be used to control pixel current. An upper pass-gate transistor may be used to selectively connect the gate of the drive transistor and one terminal of the capacitor to a power supply voltage. A lower pass-gate transistor may be used to selectively connect a drive sense conductor to a source node. The source node may be a node connected to the source of the drive transistor, to the anode of the light emitting diode and to the other terminal of the capacitor. Sensing and compensation of pixel current is further discussed with respect to FIGS. 1B-1D.

Figure 1B:
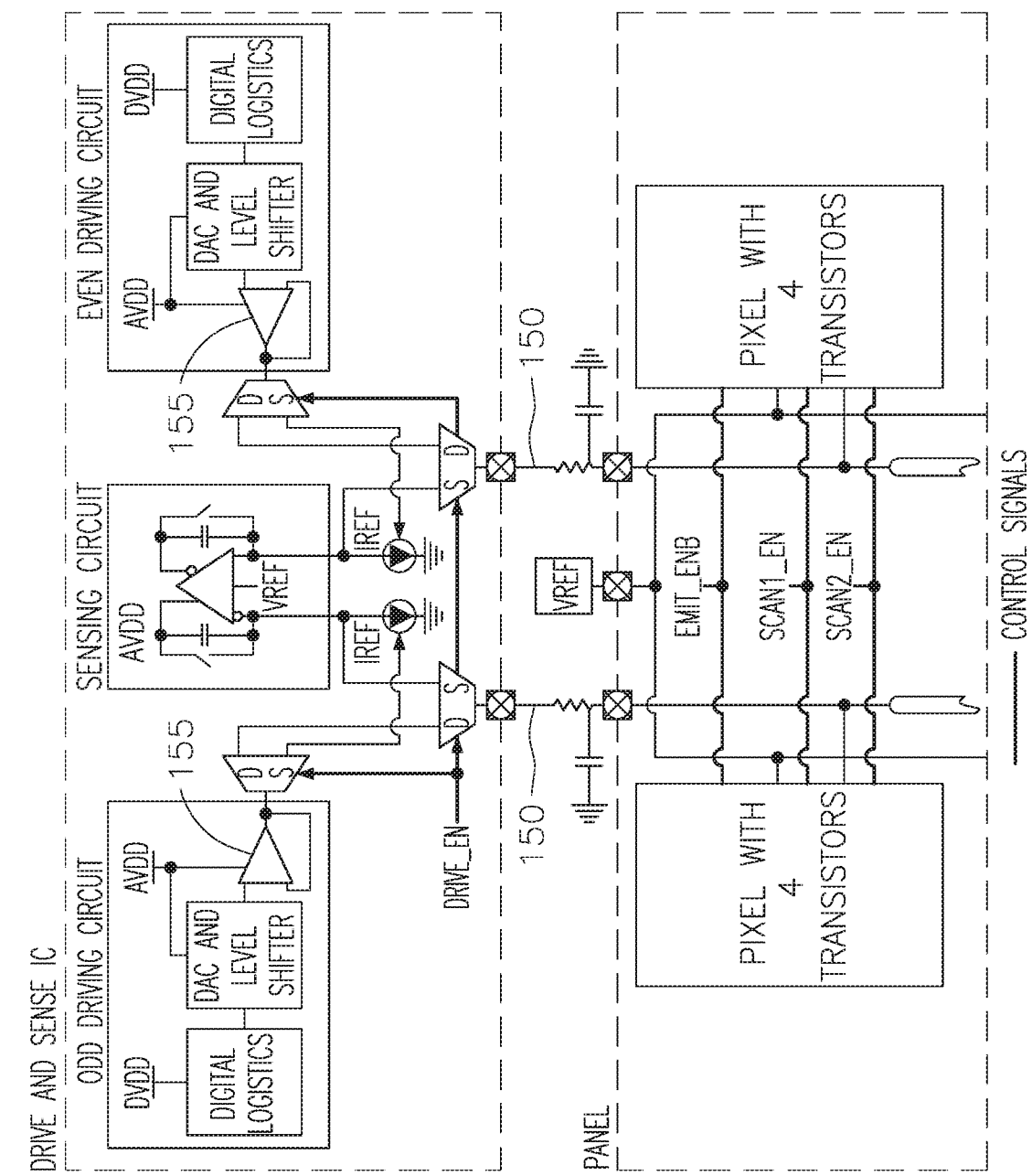
FIG. 1B is a schematic diagram of a display panel and a drive and sense integrated circuit, according to an embodiment of the present disclosure.

Referring to FIG. 1B, in some embodiments, the current of any pixel may be sensed in a differential manner, for improved accuracy. For example, if the current driven by the drive transistor of the pixel on the left of FIG. 1B (which may be referred to as an "odd" pixel) is to be sensed, it may be turned on (by charging capacitor of the odd pixel so as to turn on the drive transistor of the odd pixel), and the drive transistor of the pixel on the right of FIG. 1B (which may be referred to as an "even" pixel) may be turned off (by discharging the capacitor of the even pixel so as to turn off the drive transistor of the even pixel) and the difference between the two corresponding currents flowing out of two respective conductors, which may be referred to as "column conductors" 150, may be measured. Each of the column conductors 150 may be connected to all of the pixels of a column of the display; as a result, even if all of the pixels, other than the odd pixel being characterized, are turned off, the total leakage current in the other pixels may be significant. For example, in some embodiments, each column conductor 150 connects to many pixel rows and during the sensing operation only one pixel row is activated.

For odd sensing, (n−1) odd rows off and n even rows off. To the extent that the leakage currents in the adjacent column (containing the even pixel) are the same, the contribution of the leakage currents to the current flowing in the column conductor 150 connected to the odd pixel may be canceled when the difference between the currents in the two column conductors 150 is sensed.

The SCAN1, SCAN2, and EMIT control lines may be per row, and may have different timing between rows. In some embodiments, differential sensing may be used, so that half the pixels in a row are sensed per operation. The same set of gate control signals may be applied to odd and even pixels, such that there is no distinction between odd and even pixels. Each digital to analog converter and associated drive amplifier 155 may be used both to drive a column conductor 150 to charge the capacitor of a pixel, and to generate the reference current when the current driven by the drive transistor is being sensed; which may be accomplished by using multiplexers, as shown. In the example embodiment of FIG. 1B, VREF=ELVSS=−1.5V.

Figure 1C:
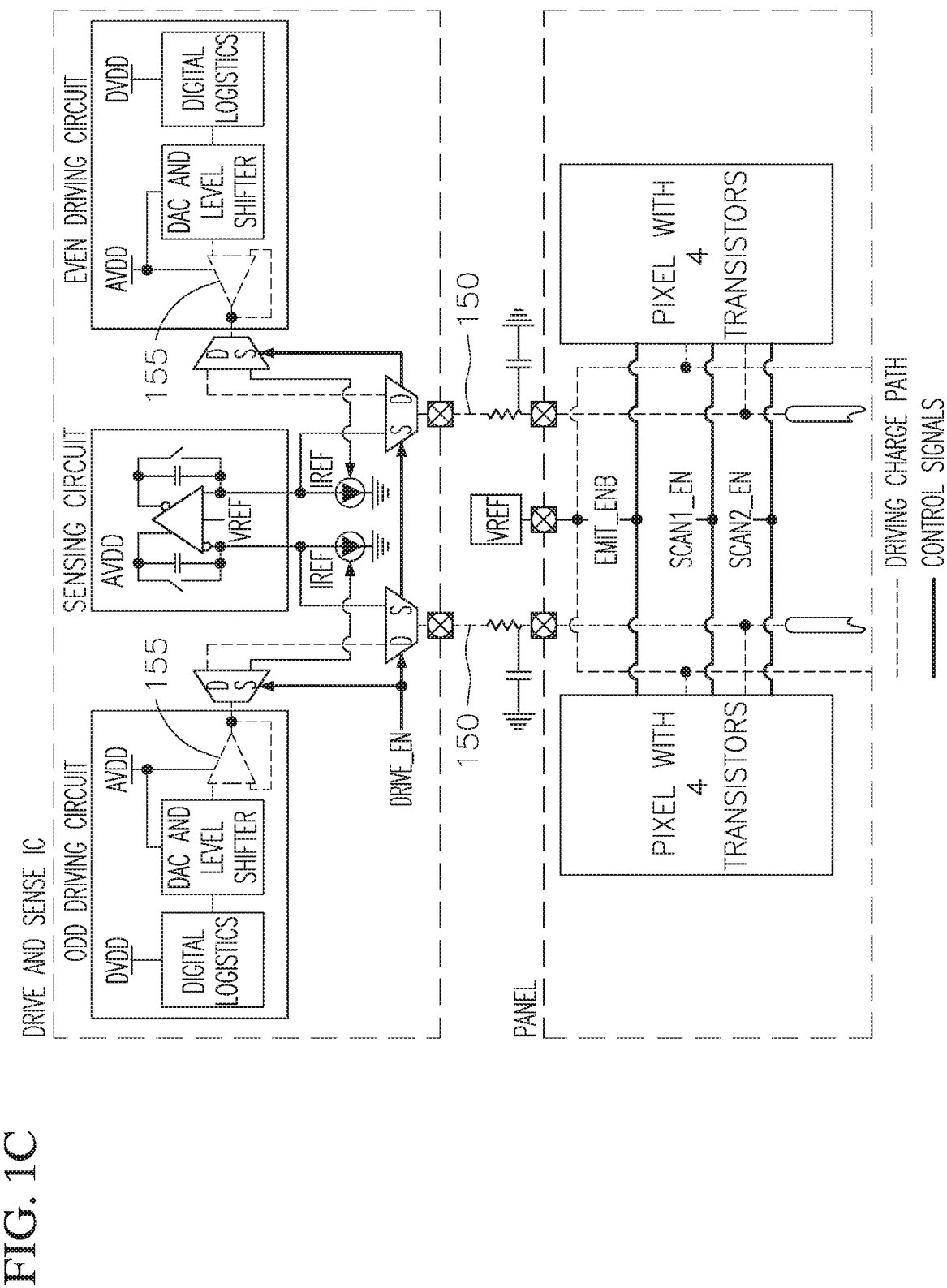
FIG. 1C is a schematic diagram of a display panel and a drive and sense integrated circuit, according to an embodiment of the present disclosure.

Referring to FIG. 1C, in some embodiments, when the circuit is in drive mode, the gate of the drive transistor of each pixel is at ELVSS, and the source of the drive transistor of each pixel is driven to VDATA (or in some embodiments the source of the drive transistor of each pixel is driven to ELVSS−VDRIVE), so that, $$-VGS=(VREF-VDATA \text{ (or } ELVSS-(ELVSS-VDRIVE)=VDRIVE).$$

The emit transistor of each pixel may remain turned off. During this process, a respective VDRIVE may be stored across the pixel capacitor of each of the pixels.

In some embodiments, when sensing the odd pixel, the VGS for the drive transistor of the even pixel may be $$VGS=(VDRIVE-VDATA)<0,$$

Therefore, when sensing the odd pixel, the drive transistor of the even pixel may be turned off (or, in some embodiments, when sensing the odd pixel, the VDRIVE used for the drive transistor of the even pixel may be ELVSS, so that it will be turned off).

Figure 1D:
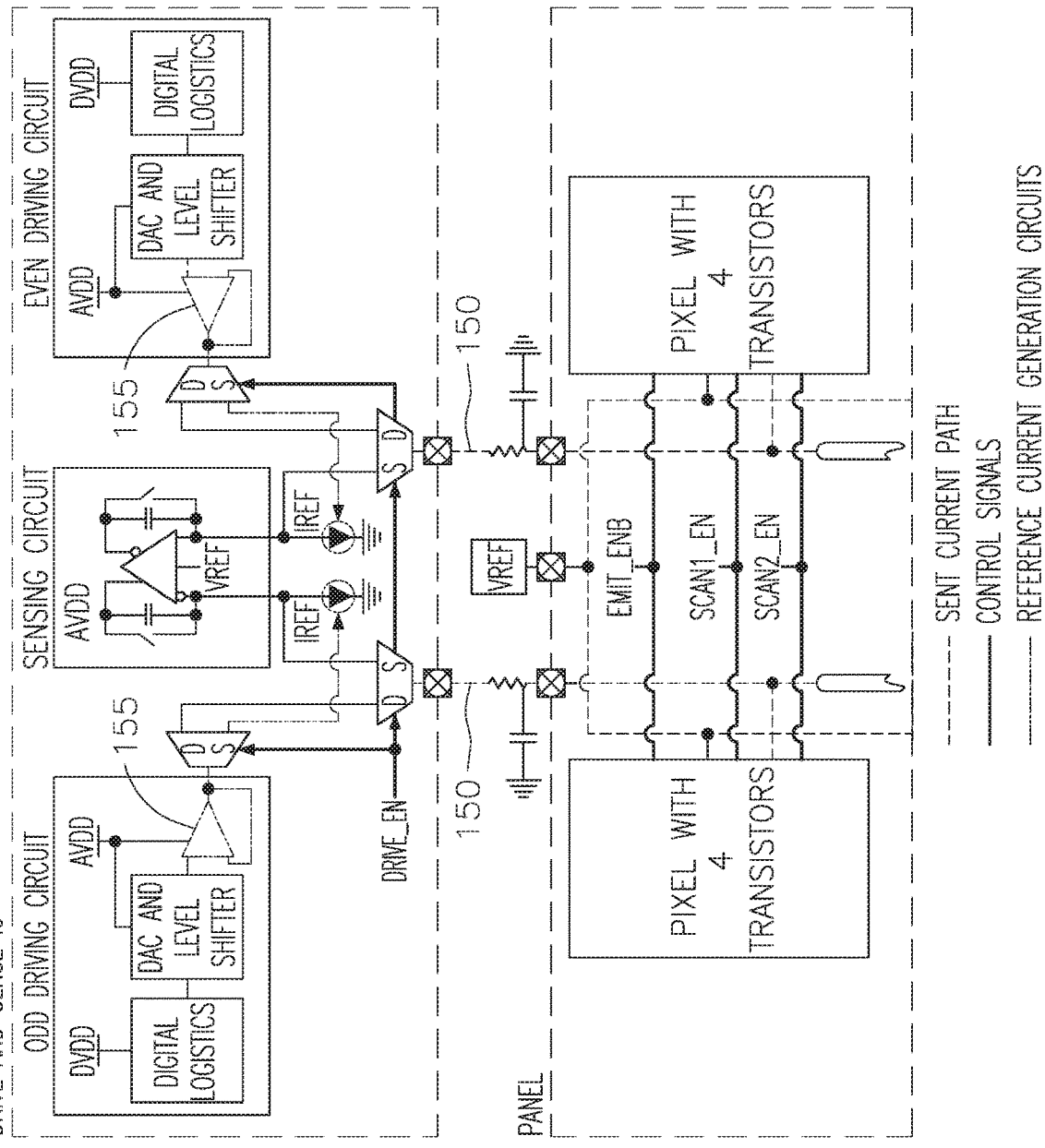
FIG. 1D is a schematic diagram of a display panel and a drive and sense integrated circuit, according to an embodiment of the present disclosure.

Referring to FIG. 1D, in some embodiments, when the circuit is in sense mode, the upper pass-gate transistors are turned off so that the gates of the drive transistors float, and so that the charge on the capacitor of each pixel remains constant, because the capacitor of each pixel may not be able to discharge. The source of the drive transistor of each pixel is driven to ELVSS so that each light emitting diode is reverse-biased, and so that no current flows through the light emitting diodes. The emit transistor of each pixel is turned on, and as a result of the light emitting diode being reverse-biased, any current driven by the drive transistor of a pixel flows through a respective column conductor 150 to the sensing circuit. In this mode, the digital to analog converter and the drive amplifier 155 connected to it may generate the reference current IREF. In some embodiments the reference current is generated by controlling the digital to analog converter and the drive amplifier 155 to produce a voltage ramp, which is applied to a capacitor to provide a current according to the following equation:

$$IREF=CdV/dt.$$

In operation, the front-end integrator may be reset prior to the sense operation. Each sense operation may be preceded by a drive operation during which the drive amplifier 155 drives the column conductor 150 to a set voltage. Before a sense operation starts, the voltage on the column conductor 150 may be restored to VREF. In some cases, in the circuit of FIG. 1D, because the capacitance to ground of the column conductor 150 may be large, the sense amplifier (in reset mode) may require a long time to bring the voltage of the column conductor 150 to VREF.

Referring back to FIG. 1A, a pixel drive and sense circuit 145 (discussed in further detail with respect to FIG. 2) may be connected to the drive sense conductor. The pixel drive and sense circuit 145 may include a drive amplifier and a sensing circuit, configured to be selectively connected, one at a time, to the drive sense conductor. In some embodiments, when current flows through the drive transistor, and the lower pass-gate transistor is turned off, disconnecting the drive sense conductor from the source node, current may flow through the light emitting diode, causing it to emit light. In some embodiments, when the lower pass-gate transistor is turned on and the drive sense conductor is driven to a lower voltage than the cathode of the light emitting diode, the light emitting diode may be reverse-biased and any current flowing in the drive sense conductor may flow to the pixel drive and sense circuit 145, where it may be sensed. In some embodiments, the driver integrated circuit (IC) ("DIC" in FIG. 1A) may contain the pixel drive and sense circuit 145 for each pair of columns of the display, and it may contain a table with three compensation coefficient values for each of the pixels in the column.

In some embodiments, it may be desirable to adjust the gate-source voltage (Vgs) of the drive transistor to compensate for deviations (e.g., differences from other drive transistors in the display 102, or changes with time), e.g., in the mobility or threshold voltage (Vth) of the drive transistor.

Figure 2:
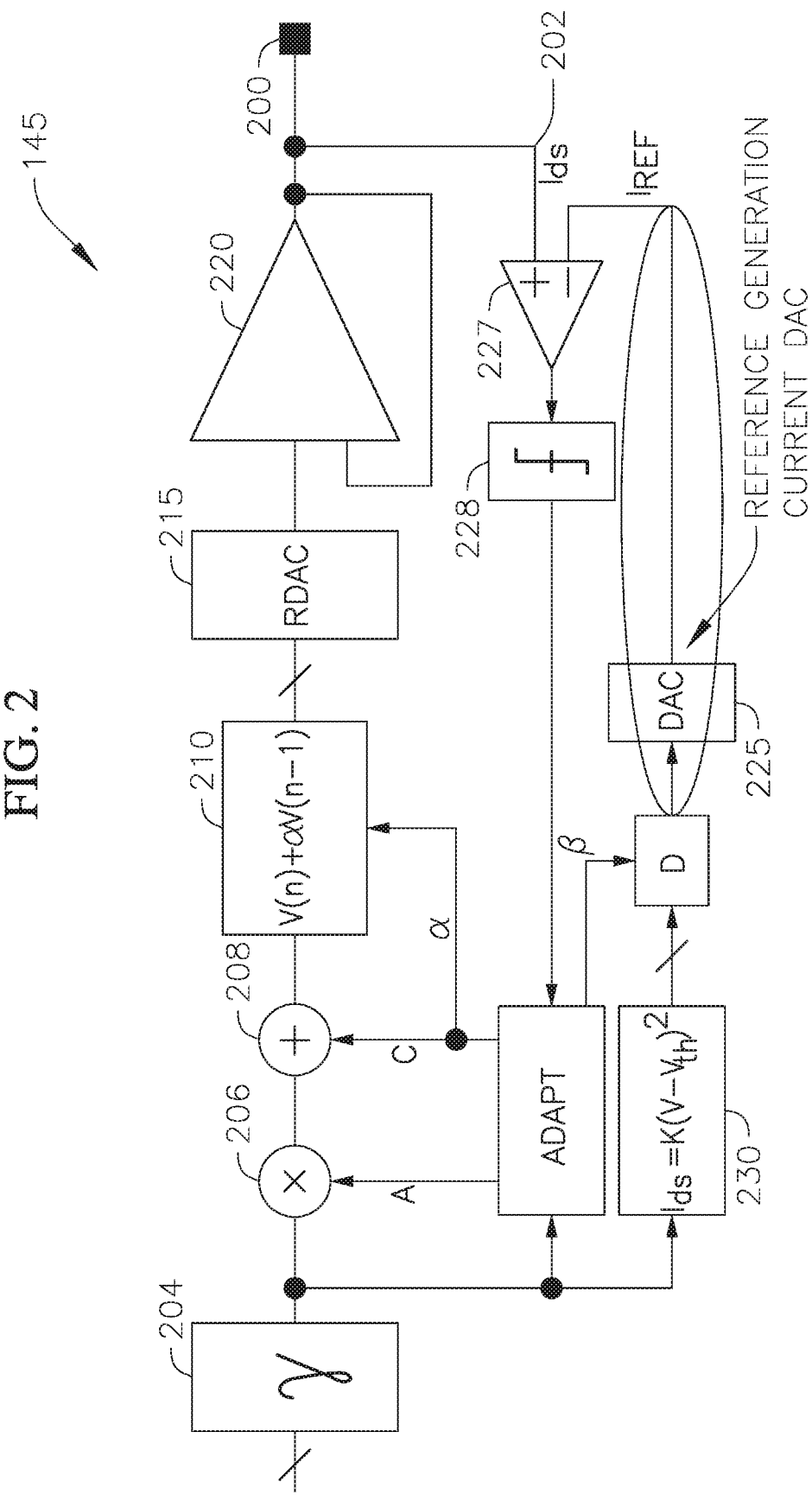
FIG. 2 illustrates a pixel drive and sense circuit, according to some example embodiments of the present disclosure.

FIG. 2 illustrates the pixel drive and sense circuit 145 of FIG. 1A, according to some example embodiments of the present disclosure. For example, FIG. 2 illustrates the pixel drive, sense, and compensation circuits. The pixel drive and sense circuit 145, includes an output 200 and an input 202, each of which may be selectively connected to the drive sense conductor of the pixel 104 through a relatively long conductor (e.g., the "column conductor" 150 of FIGS. 1B-1D) in the display 102. Either the output 200 (when the column conductor 150 is being driven) or the input 202 (when the pixel current is being sensed, as discussed in further detail below) of the pixel drive and sense circuit 145, may be connected to the column conductor 150 at any given time.

In some embodiments, during operation of the pixel drive and sense circuit 145, a gamma circuit 204 may generate a series of code words, each corresponding to a respective current to be driven through the light emitting diode by the drive transistor. Three compensation coefficients (e.g., A, C, and α) may then be used to adjust the code word generated from the gamma circuit 204. At 206, a first compensation coefficient ("A" in FIG. 2) may be multiplied by the code word from the gamma circuit 204, to form a first compensated code word 207. At 208, a second compensation coefficient ("C" in FIG. 2) may be added to the first compensated code word 207 to form a second compensated code word 209. These two compensation steps (e.g., 206 and 208) may be used to compensate, approximately, (i) for any difference between the mobility of the drive transistor and the mobility of a nominal or ideal transistor, and (ii) for any difference between the threshold voltage (e.g., $V_{th}$) of the drive transistor and the threshold voltage of the nominal or ideal transistor. In some embodiments, the driver IC ("DIC" in FIG. 1A) external to the display 102 may contain a circuit substantially similar to the circuit of FIG. 2 for each pair of pixel columns of the display 102, and it may contain a table with three compensation coefficient (e.g., A, C, and α) values for each of the pixels 104 in the column. In some embodiments, some of the compensation coefficients (e.g., A, C, and α) may be shared, e.g., the driver IC (DIC of FIG. 1A) may maintain only one value of a for an entire row of the display.

A waveform generating circuit 210 may then generate, using a third compensation coefficient ("α" in FIG. 2), from the second compensated code word 209, a waveform having the following voltage: V(n)+αV(n−1))p(t) (e.g., p(t) may be a ramp generation function). In other words, this waveform containing the voltage V(n)+αV(n−1))p(t) may have a first portion at a first voltage and a second portion at a second voltage. The second voltage may be proportional to the second compensated code word 209, and it may be the voltage to be applied to the transistor (e.g., driving transistor). The first voltage may be greater, and may provide pre-emphasis to partially counteract the low-pass filtering effect of the column conductor 150 in the display 102. The third compensation coefficient α may be the ratio of the first voltage to the second voltage.

In some embodiments, the waveform represented by V(n)+αV(n−1))p(t) (at 210) may be converted to analog form by a first digital to analog converter, e.g., a resistive digital to analog converter (RDAC) 215. The converted waveform from the output of RDAC 215 is amplified by an unity gain buffer (e.g., a drive amplifier) 220 (which, at this time may be connected to the column conductor 150 in the display 102), and fed to the column conductor 150 in the display 102. In some embodiments, once the waveform from 210 is converted to analog form by the RDAC 215 and amplified by the unity gain buffer 220, the first portion, during which the output voltage of the unity gain buffer 220 is increased by the factor α, may cause the voltage on the drive sense conductor to converge more quickly to the desired value, which is the voltage at the output of the unity gain buffer 220 during the second portion of the waveform (e.g., the waveform represented by V(n)+αV(n−1))p(t) at 210). Pixel compensation is discussed in further details in U.S. patent application Ser. No. 16/657,680, filed on Oct. 18, 2019, the entire content of which is hereby incorporated by reference.

In some embodiments, when the input 202 is connected to the column conductor 150 and when current is not driven through the light emitting diode (e.g., because the light emitting diode is reverse-biased), the pixel drive and sense circuit 145 may be employed to sense the current being driven by the drive transistor. In current sensing mode, the light emitting diode is reverse biased, and the current that flows through the drive transistor (which may be referred to as the "pixel current $I_{pixel}$") flows into the input 202 of the pixel drive and sense circuit 145. In the pixel drive and sense circuit 145, a reference current $I_{REF}$ (controlled by a second digital to analog converter DAC 225) is subtracted from the pixel current $I_{pixel}$, and the difference ($I_{error}=I_{pixel}-I_{REF}$) is processed by an operational amplifier (op-amp) or a voltage buffer 227 and a comparator (or "slicer") 228 to produce a signal that may be referred to as a "pixel current error signal" $I_{error}$ (e.g., as high or low information), and which is the difference between the pixel current $I_{pixel}$ and the reference current $I_{REF}$, for example, $I_{error}=I_{pixel}-I_{REF}$.

The compensation coefficients may then be adjusted, based on the pixel current error signal $I_{error}$, so as to cause the drive current, after compensation coefficients have been adjusted, to be more nearly equal to what it would be, for any given code word, if the characteristics (e.g., the mobility and the threshold voltage $V_{th}$) of the drive transistor were those of the nominal transistor. In some embodiments, this updating may occur iteratively, over a plurality of driving and sensing intervals (or "time intervals"), each processing a new (and potentially different) code word, and each having a respective pixel current $I_{pixel}$, a respective reference current $I_{REF}$, and a respective pixel current error signal $I_{error}$.

The reference current $I_{REF}$ may be generated by a numerical drain-source current model 230, a circuit that calculates the approximate current that the nominal transistor would drive, as follows: $I_{ds}=K(V-V_{th})^2$, where K is the mobility constant and $V_{th}$ is the threshold voltage. The output of the numerical drain-source current model 230 may be fed to the second digital to analog converter 225 as shown, to generate the reference current $I_{REF}$.

The subtracting operation of the reference current $I_{REF}$ from the pixel current $I_{pixel}$ may be done by arranging for the reference current $I_{REF}$ to have the opposite sign from that of the pixel current $I_{pixel}$, and connecting both the reference current source and the input of the pixel drive and sense circuit 145 (which in turn is connected to the column conductor 150, which carries the pixel current $I_{pixel}$) to the same output node 200, i.e., the input of the voltage buffer 227, so that the current flowing into the voltage buffer 227 is the difference between (i) the current $I_{pixel}$ flowing in from the output node 200 from the column conductor 150 and (ii) the current $I_{REF}$ flowing out of the DAC 225. In some embodiments, a controller controls state changes of the circuit of FIG. 2, e.g., determining when each time interval begins, controlling the switches (not shown) used to selectively connect the input 202 and the output 200 of the pixel drive and sense circuit 145 to the column conductor, and sending control signals to the upper pass-gate transistor and the lower pass-gate transistor. This has been explained above in more detail with respect to FIGS. 1B-1D.

Current mode sensing is essential to compensate both mobility and threshold voltage (e.g., $V_{th}$) of the drive transistor. Current mode sensing requires high resolution reference current $I_{REF}$, which allows the substantially accurate generation of $I_{error}=I_{pixel}-I_{REF}$. In some embodiments, high resolution $I_{REF}$ generation with additional DAC (e.g., RDAC 215 and DAC 225) requires significant area penalty. Some example embodiments of the present disclosure provides a method of reference current $I_{REF}$ generation, which is used for compensation of both the mobility and threshold voltage (e.g., $V_{th}$) of the display pixel 104 thin film transistor (TFT) or the drive transistor.

In some embodiments, only one of the first digital to analog converter RDAC 215 and the second digital to analog converter DAC 225 is active at any time. For example, the first digital to analog converter RDAC 215 is active when the output 200 of the pixel drive and sense circuit 145 is connected to the column conductor and the pixel 104 is being driven, and the second digital to analog converter DAC 225 is active when the input 202 of the pixel drive and sense circuit 145 is connected to the column conductor and the pixel current $I_{pixel}$ is being sensed. In some embodiments, it may not be desirable to employ two digital to analog converters (e.g., RDAC 215 and DAC 225), because, during sensing of the pixel current $I_{pixel}$, the unity gain buffer 220 remains idol. Instead, a single digital to analog converter (e.g., RDAC 215 or DAC 225) connected to the input and output nodes (e.g., 200 and 202) of the pixel drive and sense circuit 145 may be used to perform both functions (e.g., driving and sensing). In some embodiments, the reference current source is implemented using a digital to analog converter driving a capacitor with a voltage ramp. Such an implementation may result in higher accuracy, when small currents are to be produced.

In some embodiments, during the sensing mode, the RDAC 215 and the source amplifier or the unity gain buffer 220 may be utilized to generate the reference current $I_{REF}$. The source amplifier or the unity gain buffer 220 may be the most accurate element in the display IC (or the DIC). Reusing the RDAC 215 and the source amplifier or the unity gain buffer 220 for reference current $I_{REF}$ generation ensures that the reference current $I_{REF}$ is substantially accurate at the driving voltage.

As mentioned above, differential sensing may be used to sense the current of any pixel, so that half the pixels in a row are sensed per operation. The same set of gate control signals may be applied to odd and even pixels, such that there is no distinction between the odd and even pixels. Each digital to analog converter (e.g., RDAC 215) and associated unity gain buffer 220 may be used both to drive a column conductor to charge the capacitor of a pixel, and to generate the reference current $I_{REF}$ when the current driven by the drive transistor is being sensed.

Figure 3:
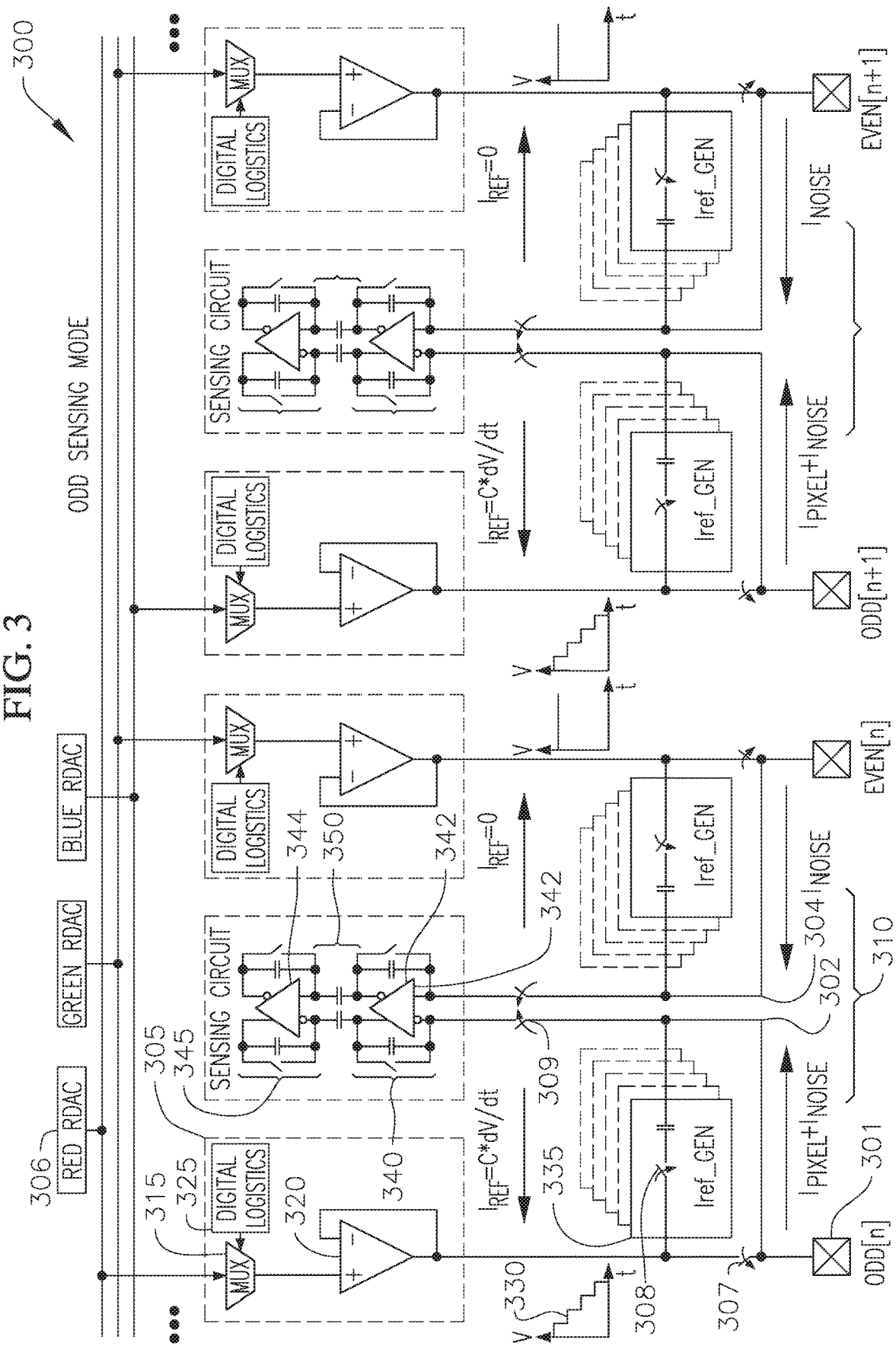
FIG. 3 illustrates another pixel drive and sense circuit, according to some example embodiments of the present disclosure.
Figure 4:
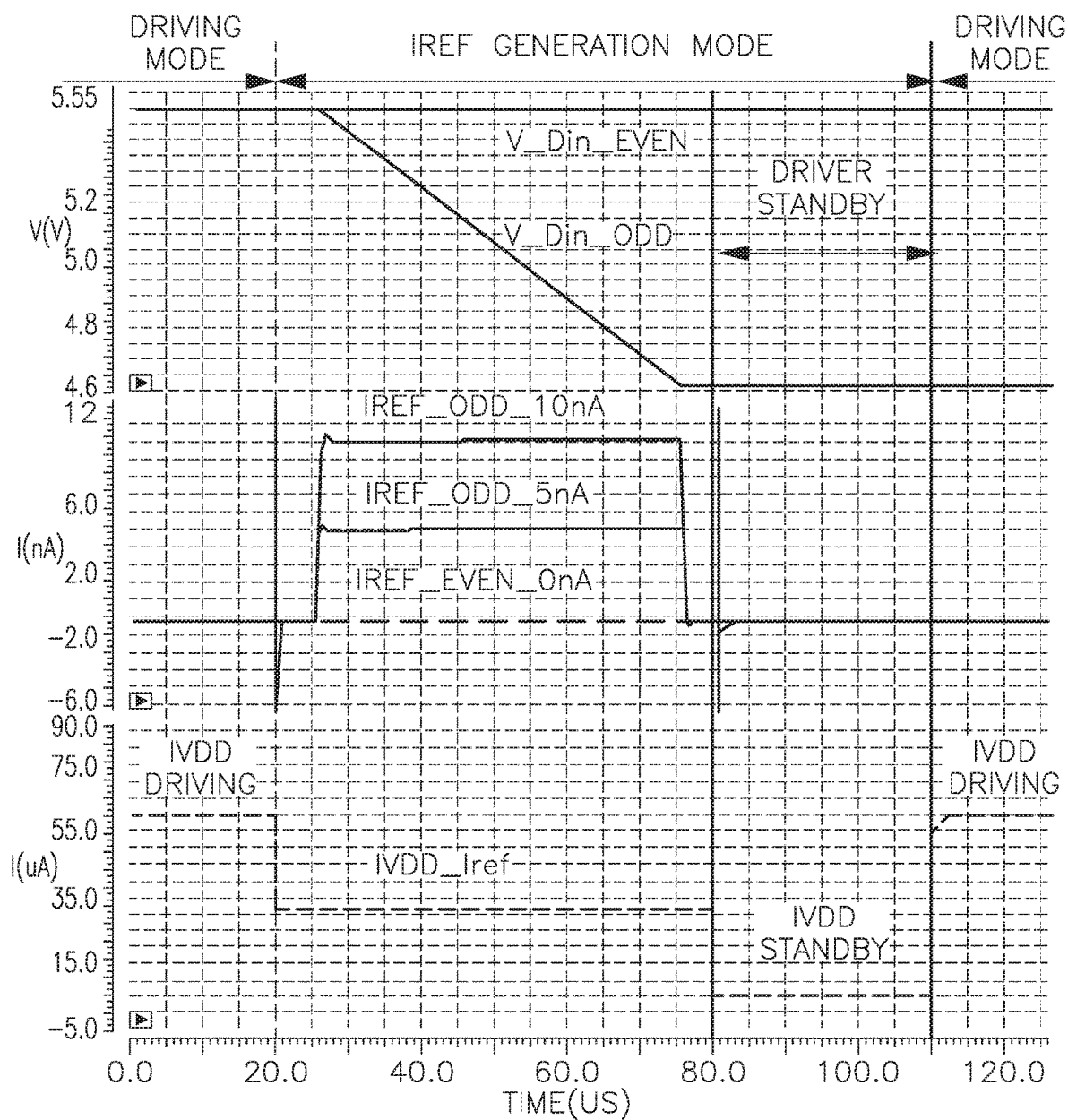
FIG. 4 illustrates different voltage and current waveforms during the sensing mode or reference current generation mode of the pixel drive and sense circuit of FIG. 3.

FIG. 3 illustrates a pixel drive and sense circuit 300, according to some example embodiments of the present disclosure. FIG. 4 illustrates different voltage and current waveforms during the sensing mode or reference current $I_{REF}$ generation mode of the pixel drive and sense circuit 300. As discussed with respect to "DIC" of FIG. 1A, in some embodiments, the pixel drive and sense circuit 300 may be external to the display panel.

The circuit of FIG. 3 includes a driver 305 for each pixel column of a display, a sensing circuit 310 for each pixel column or a pair of pixel columns of the display, and a capacitor bank 335 connected between the driver 305 and the sensing circuit 310 via a plurality of switches 307, 308, and 309. The plurality of switches 307, 308, and 309 may be transistor switches.

In the circuit of FIG. 3, the driver 305 includes a multiplexer (MUX) 315 connected to a digital to analog converter RDAC 306 and a digital logic 325 circuit at an input terminal of the MUX 315. The RDAC 306 is located outside the driver 305 and connected to a data line of the display (e.g., display 100). The MUX 315 (which may be shared between all pixel columns of the same color pixel) is connected to the RDAC 306 via the data line of the display. The data line of the display may be a 10 bit data line.

The driver 305 also includes an operational amplifier (op-amp) or an unity gain buffer (e.g., driving amplifier) 320 connected to the MUX 315 at the output terminal of the MUX 315. The output terminal of the MUX 315 is connected to a positive input terminal of the unity gain buffer 320. The negative input terminal of the unity gain buffer 320 is connected to an output terminal of the unity gain buffer 320. The unity gain buffer 320 is configured to generate at the output terminal of the unity gain buffer 320 a voltage ramp 330.

The capacitor bank 335 is connected to the output terminal of the unity gain buffer 320 via a switch 308 at an input terminal of the capacitor bank 335. The capacitor bank 335 is configured to generate the reference current $I_{REF}$ based on the capacitance value "C" of the capacitor bank 335 and the voltage ramp 330 value at an output terminal of the capacitor bank 335. In some embodiments, the reference current $I_{REF}$ is equal to $C*dV/dt$, where C is the capacitance value of the capacitor bank 335 and the voltage ramp is represented as $dV/dt$, where dV is a change in voltage over time t at the output terminal of the unity gain buffer 320. The capacitor bank 335 is further connected to the sensing circuit 310 at an output terminal of the capacitor bank 335 via a switch 309.

In some embodiments, a controller controls state changes of the circuit of FIG. 3, e.g., determining when each time interval (e.g., driving mode or reference current IREF generation mode as shown in FIG. 4) begins, controlling the switches 307, 308, and 309 used to selectively connect the input 301 of the pixel drive and sense circuit 300 to the column conductor (e.g., selectively sending control signals to the upper pass-gate transistor and the lower pass-gate transistor).

In some embodiments, when the circuit is in sense mode, the upper pass-gate transistors are turned off so that the gates of the drive transistors float, and so that the charge on the capacitor of each pixel 104 remains constant. In current sensing mode, the light emitting diode is reverse biased, and the current that flows through the drive transistor (which may be referred to as the "pixel current $I_{pixel}$") flows into the input 302 or 304 of the sensing circuit 310 via the switch 309. The differential sensing circuit 310 includes two inputs 302 and 304 for sensing a difference between a current from a first pixel or a first sub-pixel (e.g., an odd pixel "ODD[n]" or an odd sub-pixel) and a second pixel or a second sub-pixel (e.g., an even pixel "EVEN[n]" or an even sub-pixel). Each current of the currents from the first pixel (e.g., $I_{pixel}+I_{noise}$) and the current from the second pixel ($I_{noise}$) having subtracted from it a respective reference current $I_{REF}$. In differential and odd sensing, odd side $I_{REF}=C*dV/dt$ and even side $I_{REF}=0$ as $dV=0$. The difference ($I_{error}=I_{pixel}+I_{noise}-I_{REF}$) is processed by the sensing circuit 310 to produce a signal that may be referred to as a "pixel current error signal" $I_{error}$, and which is the difference between the pixel current $I_{pixel}$ and the reference current $I_{REF}$, for example, $I_{error}=I_{pixel}-I_{REF}$. The compensation coefficients may then be adjusted, based on the pixel current error signal $I_{error}$, so as to cause the drive current, after compensation coefficients have been adjusted, to be more nearly equal to what it would be, for any given code word, if the characteristics (e.g., the mobility and the threshold voltage $V_{th}$) of the drive transistor were those of the nominal transistor.

The overall pixel current $I_{pixel}$ compensation system is one bit decision circuit, which is either $I_{pixel}$ higher than $I_{REF}$ or lower than $I_{REF}$. Based on this information, the pixel current $I_{pixel}$ data may be corrected, and the pixel current $I_{pixel}$ may eventually match with reference current $I_{REF}$. In addition, these pixel current $I_{pixel}$ compensation may be done with the multiple reference $I_{pixel}$ values such as 5 nA, 10 nA, 15 nA, 20 nA to improve compensation accuracy. Because, the compensated pixel current $I_{pixel}$ value is in nA ranges, both generating the accurate reference current $I_{REF}$ and sensing front end circuit may be desirable.

For example, in order to generate the accurate reference current IREF, the digital logic 325 is provided in the driver 305 at the input of the unity gain buffer 320 (via MUX 315). Because the driver 305 has the input of 10 bits RDAC 306 and does not require driving voltage to pixel during sensing operation, ramping voltage 330 (e.g., which is dV/dt) may be generated with the digital logic 325 (e.g., the ramping voltage 330 may be generated by utilizing the RDAC 306, the MUX 315, the digital logics 325, and the unity gain buffer 320). Reference current IREF may be generated by multiplying the capacitance "C" of the capacitor bank 335 with the ramping voltage 330 (e.g., which is dV/dt). For example, the reference current IREF may be generated according to the following equation: $I_{REF}=C*dV/dt$. For the sensing circuit 310, in order to cancel common noise such as leakage current and $I_{noise}$ due to supply noise, the fully differential sensing circuit may be used. For example, in the odd side input current of the sensing circuit 310 is $I_{error}=I_{pixel}+I_{noise}-I_{REF}$, and the even side input current of the sensing circuit 310 is $I_{noise}$. Therefore, $I_{error}=I_{pixel}-I_{REF}$ may only be the sensing circuit 310 input, and the common noises (e.g., $I_{noise}$) are canceled. Therefore, the example system and method of reference current IREF generation, as discussed with respect to FIGS. 3 and 4, may add little to no additional device noise and may also allow for the generation of a low noise reference current $I_{REF}$.

In the reference current $I_{REF}$ generation mode, the pixel drive and sense circuit 300 operates with the total half current compare to driving operation by using bias control to reduce current (or overall biases) during ramp generation. For example, in some embodiments, the driver 305 or the unity gain buffer 320 may use less supply current, 35 uA, during sensing operation, which is half current of driving mode operation, 60 uA as controlling bias circuit because it does not drive the huge panel wire. Also, the driver 305 or the unity gain buffer 320 has standby mode operation, which is using minimum supply current and the fast power on time capability, therefore, the driver 305 or the unity gain buffer 320 may change their mode (e.g., sensing mode to driving mode) without delay. In some embodiments, in reference current $I_{REF}$ generation mode, the driver 305 may be turned-off to reduce power, because it has fast on-off capability.

In some embodiments, a plurality of reference current $I_{REF}$ values (e.g., $I_{REF}$ values 5 nA, 10 nA, 15 nA, 20 nA) may be generated utilizing a plurality of different cap banks 335 values. In such a case, the capacitor bank 335 may be a variable capacitor. In some embodiments, the zero reference current $I_{REF}=0$ nA may be generated when the input voltage (e.g., V_Din_even) of the unity gain amplifier 320 is a constant voltage in even pixels instead of ramping voltage 330 (or ramping down voltage) in case of off odd pixels. Because V_Din_even voltage is constant, $I_{REF}$_even=0 nA. However, V_Din_odd is ramping down 1V/50 us, and it generates 5 nA with 250 fF (e.g., capacitance of the capacitor bank 335) or 10 nA with 2*250 fF. Moreover, the difference between the rise and fall time of the generated reference current $I_{REF}$ with those of the pixel current $I_{pixel}$ (e.g. $I_{error}=I_{pixel}-I_{REF}$) may be achieved by changing the initial ramp-rate of the output of the unity gain amplifier 320 or by advancing or delaying the start of the ramp of the output of the unity gain amplifier 320.

Returning back to FIG. 3, in some embodiments, the differential sensing circuit 310 has a two-stage architecture with a low-pass current filter 340 (or "differential low-pass filter") as the first stage, and an integrator 345 (or "differential integrator") (e.g., a second integrator, as shown) as the second stage. The differential low-pass filter 340 includes a differential input and a differential output. A first conductor of the differential input of the differential low-pass filter 340 is configured to receive a difference between a pixel current and a reference current (e.g., $I_{error}=I_{pixel}-I_{REF}$). The differential integrator 345 includes a differential input and a differential output.

The integrator 345 may be coupled to the low-pass current filter 340 by two mirroring capacitors 350. For example, two mirroring capacitors 350 may couple the differential output of the differential low-pass filter 340 to the differential input of the differential integrator 345. Each of the low-pass current filter 340 and the integrator 345 may include a fully differential operational amplifier with a capacitor (or "feedback capacitor") in each feedback path. For example, the low-pass current filter 340 includes an voltage buffer 342 with a capacitor (or "feedback capacitor") in each feedback path and the integrator 345 includes an voltage buffer 344 with a capacitor (or "feedback capacitor") in each feedback path. For example, the differential low-pass filter 340 includes a differential amplifier 342, two feedback capacitors, each connected between a respective conductor of the differential output of the differential low-pass filter 340 and a corresponding conductor of the differential input of the differential low-pass filter 340, and two reset switches, each connected across a respective feedback capacitor of the two feedback capacitors and configured to selectively discharge the respective feedback capacitor. In some embodiments, the differential amplifier 342 is a fully differential amplifier. In some other embodiments, the differential amplifier 342 is a pseudo differential amplifier. For example, the differential integrator 345 includes a fully differential amplifier 344, two feedback capacitors, each connected between a respective conductor of the differential output of the differential integrator 345 and a corresponding conductor of the differential input of the differential integrator 345, and two reset switches, each connected across a respective feedback capacitor of the two feedback capacitors and configured to selectively discharge the respective feedback capacitor.

As mentioned above, the circuit 310 may be used to perform differential sensing between two adjacent pixels (e.g. a red pixel and a blue pixel (of a composite pixel containing three pixels, a red pixel, a green pixel, and a blue pixel), or a green pixel and a red pixel of a composite pixel).

In some embodiments, the low-pass current filter 340 and the differential integrator 345 may be fully differential. As used herein, a fully differential circuit is one that (unlike a single-ended or pseudo-differential amplifier) does not compare the signal to a fixed reference voltage. Instead, each differential gain stage in a fully differential amplifier, for example, compares the two signals being processed directly to each other.

The output of the sensing circuit 310 of FIG. 3 may include contributions from several sources of noise, in addition to the contribution from the current to be sensed (the difference between (i) the current driven by the drive transistor (e.g., drive transistor) of the odd pixel and (ii) the reference current $I_{REF}$). The sensing circuit is discussed in further details in U.S. patent application Ser. No. 16/656,423, filed on Oct. 17, 2019, the entire content of which is hereby incorporated by reference.

In some embodiments, numerical or data processing operations may be performed by one or more processing circuits. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for reference signal generation by reusing the driver circuit have been specifically described and illustrated herein, many modifications and variations will be apparent to those skilled in the art. Accordingly, it is to be understood that a system and method for reference signal generation by reusing the driver circuit constructed according to principles of this invention may be embodied other than as specifically described herein. The invention is also defined in the following claims, and equivalents thereof.

What is claimed is:

1. A display compensation circuit comprising:
a driver circuit configured to drive pixels of a display panel; and
a compensation circuit comprising a current-mode sensing circuit and a reference current generator circuit,
wherein the reference current generator circuit is connected to an output terminal of the driver circuit and comprises a capacitor bank, the reference current generator circuit being configured to generate a reference current based on a capacitance value of the capacitor bank and a voltage ramp value of a voltage ramp received from the driver circuit, and
wherein the current-mode sensing circuit is connected to an output terminal of the reference current generator circuit and configured to generate a signal to compensate for pixel variations across the display panel.

2. The display compensation circuit of claim 1,
wherein the driver circuit comprises a digital-to-analog converter (DAC), a multiplexer, a digital logic circuit, and a voltage buffer,
wherein the DAC is coupled to a data line of the display panel,
wherein the multiplexer is connected to the DAC and the digital logic circuit at an input terminal of the multiplexer,
wherein an input terminal of the voltage buffer is connected to an output terminal of the multiplexer, wherein the driver circuit is configured to generate the voltage ramp at an output terminal of the voltage buffer, the output terminal of the voltage buffer being connected to the output terminal of the driver circuit, and
wherein an input terminal of the reference current generator circuit is connected to the output terminal of the voltage buffer.

3. The display compensation circuit of claim 2, wherein the multiplexer is coupled to the DAC via the data line of the display panel, wherein the voltage ramp is generated by the DAC, the multiplexer, and the digital logic circuit of the driver circuit, wherein the data line of the display panel is a 10-bit data line, wherein the pixel variations comprise threshold voltage and mobility variations of a driving transistor of a pixel of the display panel, and wherein the display compensation circuit is external to the display panel.

4. The display compensation circuit of claim 2, wherein the input terminal of the voltage buffer comprises a positive input terminal and a negative input terminal, wherein the positive input terminal of the voltage buffer is connected to the output terminal of the multiplexer and the negative input terminal of the voltage buffer is connected to the output terminal of the voltage buffer.

5. The display compensation circuit of claim 2, wherein the capacitor bank of the reference current generator circuit is connected to the output terminal of the voltage buffer of the driver circuit via a first switch at the input terminal of the reference current generator circuit, wherein the first switch is a transistor switch.

6. The display compensation circuit of claim 2, wherein the reference current is equal to C*dV/dt, wherein C is the capacitance value of the capacitor bank and dV/dt is the voltage ramp value, wherein dV is change in voltage over time t at the output terminal of the voltage buffer, and wherein the capacitor bank is a variable capacitor and wherein the reference current generator circuit is configured to generate a plurality of reference current values based on different capacitance values of the variable capacitor.

7. The display compensation circuit of claim 1, wherein the current-mode sensing circuit is connected at the output terminal of the reference current generator circuit via a second switch, wherein the second switch is a transistor switch.

8. The display compensation circuit of claim 7, wherein the current-mode sensing circuit comprises:
a differential low-pass filter having a differential input and a differential output, a first conductor of the differential input being configured to receive a difference between a pixel current and a reference current;
a differential integrator having a differential input and a differential output; and
two mirroring capacitors coupling the differential output of the differential low-pass filter to the differential input of the differential integrator.

9. The display compensation circuit of claim 8, wherein the differential low-pass filter comprises:

a differential amplifier;
two feedback capacitors, each connected between a respective conductor of the differential output of the differential low-pass filter and a corresponding conductor of the differential input of the differential low-pass filter; and
two reset switches, each connected across a respective feedback capacitor of the two feedback capacitors and configured to selectively discharge the respective feedback capacitor.

10. The display compensation circuit of claim 9, wherein the differential amplifier is a fully differential amplifier.

11. The display compensation circuit of claim 9, wherein the differential amplifier is a pseudo differential amplifier.

12. The display compensation circuit of claim 8, wherein the differential integrator comprises:
a fully differential amplifier;
two feedback capacitors, each connected between a respective conductor of the differential output of the differential integrator and a corresponding conductor of the differential input of the differential integrator; and
two reset switches, each connected across a respective feedback capacitor of the two feedback capacitors and configured to selectively discharge the respective feedback capacitor.

13. A system comprising a display having a plurality of pixels and a display driver configured to drive the plurality of pixels of the display, the display driver comprising:
a pixel driver; and
a capacitor bank,
wherein the pixel driver comprises a multiplexer, a digital logic circuit, and a voltage buffer, wherein:
the multiplexer is connected to the digital logic circuit at an input terminal of the multiplexer,
an input terminal of the voltage buffer is connected to an output terminal of the multiplexer, and
an input terminal of the capacitor bank is connected to an output terminal of the voltage buffer,
wherein the capacitor bank is configured to generate a reference current to compensate characteristics of a pixel of the display based on a capacitance value of the capacitor bank and a voltage ramp value of a voltage ramp at the output terminal of the voltage buffer.

14. The system of claim 13, wherein the display driver further comprises a digital-to-analog converter (DAC) coupled to a data line of the display, wherein the multiplexer is connected to the DAC at the input terminal of the multiplexer.

15. The system of claim 14, wherein the voltage buffer is configured to generate the voltage ramp at the output terminal of the voltage buffer.

16. The system of claim 15, wherein the capacitor bank is configured to generate the reference current based on the capacitance value of the capacitor bank and the voltage ramp value of the voltage ramp at the output terminal of the voltage buffer.

17. The system of claim 16, wherein the reference current is equal to C*dV/dt, wherein C is the capacitance value of the capacitor bank and dV/dt is the voltage ramp value, wherein dV is change in voltage over time t at the output terminal of the voltage buffer.

18. The system of claim 13, wherein the input terminal of the voltage buffer comprises a positive input terminal and a negative input terminal, wherein the positive input terminal of the voltage buffer is connected to the output terminal of the multiplexer and the negative input terminal of the voltage buffer is connected to the output terminal of the voltage buffer.

19. The system of claim 13, wherein the capacitor bank is a variable capacitor and wherein the system is configured to generate a plurality of reference current values based on different capacitance values of the variable capacitor.

20. A method for generating a reference current to compensate characteristics of a pixel of a display, the method comprising:

generating a voltage ramp at an output terminal of a driving amplifier of a pixel driver, wherein the driving amplifier is configured to receive an input from a multiplexer and a digital logic circuit of the pixel driver and generate the voltage ramp based on the input received from the multiplexer and the digital logic circuit;

performing multiplication of a value of the voltage ramp and a capacitance value of a capacitor bank connected at the output terminal of the driving amplifier; and generating the reference current at an output terminal of the capacitor bank to compensate mobility and voltage threshold characteristics of the pixel of the display.

\* \* \* \* \*